United States Patent [19]

Brady et al.

[11] 4,436,797

[45] Mar. 13, 1984

[54] X-RAY MASK

[75] Inventors: Michael J. Brady, Brewster; Bernard S. Meyerson, Yorktown Heights, both of N.Y.; John M. Warlaumont, Ridgewood, N.J.

[73] Assignee: International Business Machines Corporation, Armonk, N.Y.

[21] Appl. No.: 394,018

[22] Filed: Jun. 30, 1982

[51] Int. Cl.$^3$ .................... F24F 13/00; B05B 5/00; C23C 15/00; B32B 9/00
[52] U.S. Cl. ..................... 430/5; 428/408; 428/446; 428/426; 427/65; 427/160; 204/192 C; 204/192 SP; 204/192 E; 430/967
[58] Field of Search ............. 428/408, 446; 427/65, 427/160; 204/192 C, 192 SP, 192 E; 430/5

[56] References Cited

U.S. PATENT DOCUMENTS

| | | | |
|---|---|---|---|
| 3,577,325 | 5/1971 | Fairchild | 428/408 |
| 3,742,230 | 6/1973 | Spears et al. | 250/65 R |
| 3,824,100 | 7/1974 | Griest | 430/5 |
| 3,925,677 | 12/1975 | Fraser | 250/505 |
| 4,037,111 | 7/1977 | Coquin et al. | 250/505 |
| 4,060,660 | 11/1977 | Carlson et al. | 428/408 |
| 4,198,263 | 4/1980 | Matsuda | 156/639 |
| 4,218,503 | 8/1980 | Reekstin et al. | 428/195 |
| 4,260,670 | 4/1981 | Burns | 430/5 |
| 4,301,237 | 11/1981 | Burns | 340/394 |

OTHER PUBLICATIONS

"Spin Resonance Spectroscopy of Amorphous Carbon Films," by R. J. Gambino and J. A. Thompson, Solid State Communications, 34, 15–18, (1980).

"The Growth Kenetics and Properties of Hard and Insulating Carbonaceous Films Grown in an R. F. Discharge," by S. M. Ojha, H. Norstrom and D. McCulluch, Thin Solid Films, 60, 213–225, (1979).

"Mask Technology," by A. Heuberger, Part 3 of Present Status and Problems of X—Ray Lithography, in Advances in Solid State Physics, edited by J. Treusch, 265–274, (Friedr. Vieweg & Sohn, Wiesbaden, W. Ger., 1980).

"Dielectric Properties of Some Thin Organic Polymer Films," by Bernard G. Carbajal, III, Trans. of the Metallurgical Soc. of AIME, 236, 364–369, (1966).

"Insulator Thin Films Formed by Glow Discharge and Radiation Techniques," by A. M. Mearns, Thin Solid Films, 3, 201–228, (1969).

"The Electrical and Optical Properties of Amorphous Carbon Prepared by the Glow Discharge Technique," by D. A. Anderson, Philosophical Magazine, 35, 17–26, (1977).

"Preparation and Characterization of Hydrogenated Amorphous Carbon Films: Electrical and Optical Properties," PhD Thesis by Bernard S. Meyerson, City University of New York, 1–117, (1980).

"The Rearrangement of Acetylene, Benzene, Ethane, Ethylene, Methane and Naphthalene in a Microwave Discharge," by F. J. Vastola and J. P. Wightman, J. Appl. Chem., 14, 69–73, (1964).

"Deposition of Hard and Insulating Carbonaceous Films on an r.f. Target in a Butane Plasma," by L. Holland and S. M. Ojha, Thin Solid Films, 38, L17–L19, (1976).

Primary Examiner—P. Ives
Attorney, Agent, or Firm—Ronald L. Drumheller

[57] ABSTRACT

An improved X-ray lithography mask has been fabricated by forming an X-ray absorbing lithography pattern on a supporting foil of hydrogenated amorphous carbon. The substrate foil is formed by depositing a carbon film in the presence of hydrogen onto a surface having a temperature below 375° C. The hydrogen concentration is maintained sufficiently high that the resulting film has at least one atom percent of hydrogen. A film having about 20 atom percent of hydrogen is preferred. While impurities are permitted, impurities must be maintained at a level such that the optical bandgap of the resulting film is at least one electron volt. A film with an optical bandgap of about 2 electron volts is preferred.

20 Claims, 7 Drawing Figures

FIG. 1.1 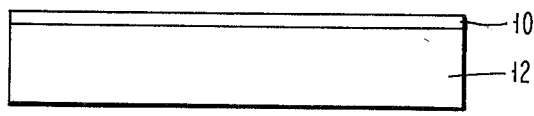
FIG. 1.2 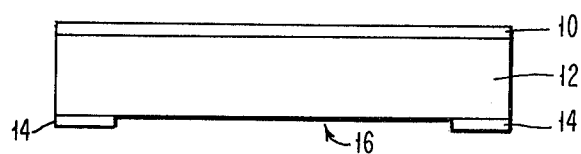
FIG. 1.3 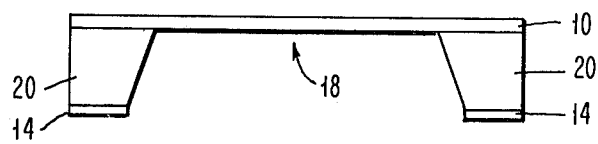
FIG. 1.4 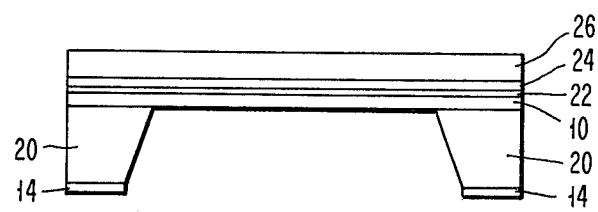
FIG. 1.5 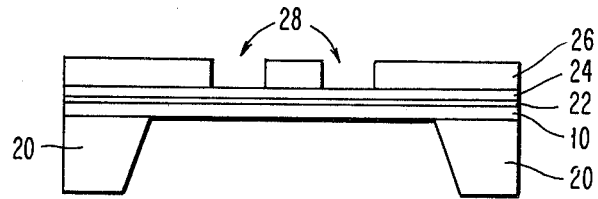
FIG. 1.6 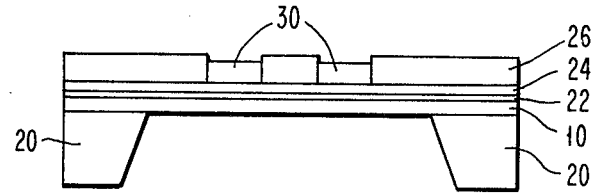
FIG. 1.7 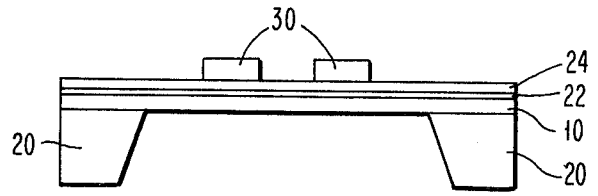

X-RAY MASK

DESCRIPTION

1. Technical Field

This invention relates to lithographic masks for fabricating microcircuits and more particularly it relates to a composition for and a method of fabricating an X-ray transparent substrate for supporting an X-ray absorbing pattern.

2. Prior Art

An X-ray lithographic mask typically comprises a thin foil substrate carrying an X-ray absorbing pattern. Since the thin foil substrate is usually only a few micrometers thick, it usually requires additional peripheral supporting structure of some kind.

Selection of a suitable X-ray absorbing material for the absorbing pattern is not too difficult. Gold is usually selected because of its widespread use already in microcircuit technology and because other choices do not have much better X-ray absorbance and cause processing problems.

Selection of a suitable material for the X-ray mask substrate is not straight-forward because an ideal substrate for an X-ray mask has many requirements.

For example, an X-ray substrate foil should have a useable area as large as possible (ideally as large as a silicon wafer), a thickness in the micron ($\mu$m) range, virtually absolute flatness, high strength, dimensional and mechanical stability against radiation, humidity, heat, etc., compatibility with fabrication of the absorber pattern and with VLSI technology in general, sufficient transparency to X-rays that adequate contrast can be achieved, and preferably transparency to visible light for alignment purposes.

Each of the currently known substrate materials meets some of these requirements well but only marginally satisfies one or more of the other requirements. Each of the currently known substrate materials does not satisfy at least one of these requirements as well as other available substrate materials. Among the materials already known for use as an X-ray mask substrate is silicon (Si), boron doped silicon (Si:B), boron nitride (BN), silicon nitride ($Si_3N_4$), silicon dioxide ($SiO_2$), beryllium (Be), silicon carbide (SiC), tungsten carbide (WC), silicon oxynitride ($Si_xO_yN_z$), alumina ($Al_2O_3$), Mylar, polymers such as polyimide (Kapton), and some mixtures and laminates of these materials.

A review of X-ray mask substrate technology may be found in A. Heuberger et al., "Mask Technology," part 3 of "Present Status and Problems of X-ray Lithography," in ADVANCES IN SOLID STATE PHYSICS, edited by J. Treusch, pages 265–274 (Friedr. Vieweg & Sohn, Wiesbaden, W.Ger., 1980). X-ray mask substrate materials are also described, for example, in U.S. Pat. Nos. 3,742,230 (Si and Si:B), 3,925,677 (glass); 4,037,111 (polyimide); 4,198,263 (Si:B); and 4,260,670 (BN, WC, $Si_3N_4$, $SiO_2$, polymers).

Currently, the requirements for an X-ray mask substrate are best met by boron doped silicon, organic materials, and silicon nitride/silicon dioxide laminates. The search continues for a material which better satisfies the requirements for an X-ray mask substrate foil.

DISCLOSURE OF THE INVENTION

An improved X-ray lithography mask has been fabricated by forming an X-ray absorbing lithography pattern on a supporting foil of hydrogenated amorphous carbon. The substrate foil is formed by depositing a carbon film in the presence of hydrogen onto a surface having a temperature below 375° C. The hydrogen concentration is maintained sufficiently high that the resulting film has at least one atom percent of hydrogen. A film having about 20 atom percent of hydrogen is preferred. While impurities are permitted, impurities must be maintained at a level such that the optical bandgap of the resulting film is at least one electron volt. A film with an optical bandgap of about 2 electron volts is preferred.

A foil of hydrogenated amorphous carbon formed in the preferred manner is substantially transparent to both X-ray radiation and visible light. The foil is also chemically inert, extremely hard, adherent to a supporting structure, resistant to scratching and stretching, and it apparently satisfies the requirements for an X-ray mask substrate better than previously known substrate materials.

BRIEF DESCRIPTION OF THE DRAWINGS

FIGS. 1.1 through 1.7 illustrate step-by-step the fabrication of an X-ray mask using a mask substrate foil having a composition in accordance with this invention.

BEST MODE FOR CARRYING OUT THE INVENTION

In accordance with this invention, an X-ray mask is formed using a substrate foil comprising hydrogenated amorphous carbon. Such a foil may be fabricated by forming a thin film of carbon in the presence of hydrogen at a suitably low temperature. The temperature at which the carbon film is formed is important because the lower the temperature (at least over some range), the more hydrogen is incorporated into the carbon film (all else being identical). The amount of hydrogen incorporated into the carbon film is important because the higher the amount of incorporated hydrogen, the greater the apparent degree of four fold symmetry in the film structure. Four fold symmetry is desired in the film structure because it corresponds to the structure of diamond, a pure carbon crystalline structure which has unusually favorable properties for an X-ray mask substrate, including visual transparency, extreme hardness, extreme durability and excellent resistance to chemical attack.

A thin film of hydrogenated amorphous carbon having properties suitable for an X-ray mask substrate may be formed, for example, by conventional glow discharge deposition, or by conventional sputter deposition or by reactive sputter deposition of a carbon film in the presence of hydrogen onto a flat surface having a temperature below 375° C., and preferably below 300° C. The best film characteristics are obtained at deposition temperatures between about 200° C. and about room temperature with about 200° C. deposition being preferred.

Glow discharge deposition of hydrogenated amorphous carbon may be done by placing in the discharge chamber of a conventional glow discharge deposition apparatus a substrate upon which a film of hydrogenated amorphous carbon is desired. A suitable gas or mixture of gases containing carbon and hydrogen is then flowed through (or contained within) the discharge chamber and a suitable A.C. or D.C. voltage is applied between two electrodes in the discharge chamber (one of which may carry the substrate) to produce a glow discharge between the electrodes. The glow discharge decomposes one or more gases in the discharge chamber to produce carbon and hydrogen ions, some of which deposit on the substrate to form a hydrogenated amorphous carbon film. The preferred gas for glow discharge deposition of hydrogenated amorphous carbon is acetylene ($C_2H_2$). Theoretically, any gas or gaseous mixture which contains carbon and hydrogen and which can be decomposed by a glow discharge to produce carbon and hydrogen ions could be used instead of acetylene. The gas or gaseous mixture in the discharge chamber also may include constituents which do not ionize or which do ionize but which do not deposit in significant quantity within the carbon film. Impurities and dopants are permitted in the hydrogenated amorphous carbon film so long as a suitable optical bandgap is still produced.

The optical bandgap ($E_o$) of hydrogenated amorphous carbon is defined by the following expression:

$$(\alpha E)^{\frac{1}{2}} = \beta(E - E_o)$$

where $\alpha$ is optical absorption, E is the energy of the incident light in electron volts and $\beta$ is a constant. On a graph of $(\alpha E)^{\frac{1}{2}}$ versus E, the optical bandgap $E_o$ is found at the point where the linear region of the plot crosses the E axis when extended. A more complete definition of optical bandgap may be found, for example, in ELECTRONIC PROCESSES IN NON-CRYSTALLINE SOLIDS, by N. Mott and E. Davis, 2 ed., pages 287–89 (Clarendon Press, Oxford, 1979).

Reactive sputter deposition of hydrogenated amorphous carbon may be done by placing a substrate upon which a deposited hydrogenated amorphous carbon film is desired into a conventional sputtering apparatus. A carbon target is used as the cathode. The deposition chamber is filled with an inert gas such as argon to which hydrogen gas (a few percent) is added. By applying a suitable D.C. or A.C. voltage between the anode and target, a glow discharge is produced. Inert element ions (i.e. argon ions) are formed and bombard the carbon target sputtering carbon atoms from the carbon target. The plasma contains hydrogen ions supplied by the hydrogen gas. Carbon atoms and hydrogen ions deposit on the substrate forming a hydrogenated amorphous carbon film.

For reactive sputter deposition, the voltage is higher than for glow discharge deposition so that ion bombardment with the cathode target ejects target atoms, thereby eroding the target. The ejected target atoms deposit on surrounding surfaces (including the substrate) along with hydrogen ions from the plasma. Since reactive sputter deposition of hydrogenated amorphous carbon includes deposition of the hydrogen from a plasma, it might be considered a form of plasma deposition, just as glow discharge deposition is a form of plasma deposition. Actually, the carbon atoms are sputtered while the hydrogen is plasma deposited simultaneously.

Target materials other than pure carbon can be used, including in theory materials which also contain hydrogen in a reactive form. If both the carbon and the hydrogen is supplied by the target, it would be called a conventional sputter disposition process. A target of polystyrene might be used, for example. In reactive sputter deposition and in sputter deposition, just as in the case of glow discharge deposition, additional ions, molecules or atoms which do not deposit significantly within the film may be present within the plasma or sputtered from the cathode. Some contamination and doping constituents are permitted within the film so long as the optical bandgap is sufficiently high, just as in a conventional glow discharge deposition of the film.

It has been found that a hydrogenated amorphous carbon film clings tenaciously to the substrate upon which it is deposited. Therefore, it is preferred that the substrate be etched or dissolved away after deposition of the film to form a foil. Portions of the substrate may be retained to provide support for the foil. For example, a central window region of the substrate may be dissolved away leaving a peripheral frame member supporting the foil, as is commonly done in this field. Obviously, in order to selectively dissolve the substrate or portion of the substrate, it must be composed of a material which can be selectively dissolved or etched with respect to a hydrogenated amorphous carbon film. Fortunately, hydrogenated amorphous carbon is nearly chemically inert making a wide variety of substrate materials available. Glass and silicon are the preferred materials for the substrate upon which the film is deposited. Glass and silicon can be isotropically etched away, for example, with hydroflouric acid (HF) while <100> silicon can be preferentially etched away along crystal planes, for example, with an aqueous mixture of ethylene diamine and pyrocatecol.

EXAMPLE I

A glass substrate is ultrasonically cleaned, rinsed, dried and placed into a conventional D.C. glow discharge deposition apparatus. Acetylene gas is flowed through the discharge region at a flow rate of about 1 standard cubic centimeter per minute (SCCM). Pressure within the discharge chamber is maintained at about 0.5 Torr. The substrate is not heated. A D.C. voltage of about 300 volts is applied to produce a glow discharge. A film deposits on the substrate surface at about 50–100Å per minute. When the coating is about 1 $\mu$m thick, the glow discharge is stopped.

The deposited coating is amorphous and composed of about 60 atom percent carbon and about 40 atom percent hydrogen. The coating is extremely hard and adheres to the glass. The optical energy gap of the coating is about 2.1 electron volts. The coating appears light tan and is highly transparent to visible light. X-ray transparency of the coating also is excellent and equals or exceeds all other known materials for X-ray mask substrates.

EXAMPLE II

Glass substrates are coated one at a time as described in Example I, except that each of the substrates is maintained by a substrate heater at a different and progressively higher elevated temperature between room temperature and 425° C.

All of the coatings are composed of carbon and hydrogen with the atom percent of hydrogen decreasing with increasing deposition temperature until at a deposition temperature of about 425° C. virtually no hydrogen can be found in the coating.

At a deposition temperature of 425° C. the coating has properties much like graphite and is unsuitable for use as an X-ray mask substrate.

The composition of the coating at a deposition temperature of 375° C. is about 1 atom percent hydrogen and the optical bandgap is about 1.0 eV. The coating appears dark in color and does not transmit visible light very well. Transmission of visible light is about the same as silicon. Transmission of X-rays equals or exceeds the X-ray transmission of silicon (depending upon wavelength) and the coating is harder, more scratch resistant, and more resistant to chemical attack than silicon. Although visual alignment cannot be done very well through such a coating, it is no worse in this respect than silicon and much better in other respects. Accordingly, this hydrogen composition (1 atom percent hydrogen) and the associated optical bandgap of 1.0 eV are considered the lowest acceptable for an X-ray mask substrate.

At progressively lower deposition temperatures, the hydrogen percentage quickly increases along with visual transparency. At a deposition temperature of about 300° C., the film is sufficiently transparent to visible light that visual alignment can be done through the film. At a deposition temperature of about 300° C., the optical bandgap is about 1.6 eV. Since X-ray substrate films which are optically transparent are particularly desired, in accordance with this invention, it is preferred to deposit the hydrogenated amorphous carbon film at a temperature below 300° C.

At a deposition temperature of about 200° C., the film is transparent to visible light and has an optical bandgap of about 2.0 eV with a hydrogen concentration of about 20 atom percent. This is the preferred deposition temperature because no substantial increase in visible light transparency is experienced at still lower temperatures and it is expected that further increase in the percentage of hydrogen might adversely affect mechanical properties of the film.

EXAMPLE III

Two substrates are coated as in Example I except that while coating the first substrate, diborane ($B_2H_6$) gas is mixed with the acetylene gas (1% diborane) and while coating the second substrate, phosphine ($PH_3$) gas is mixed with the acetylene gas. The first coating is hydrogenated amorphous carbon with a boron doping or impurity while the second coating is hydrogenated amorphous carbon with a phosphorus doping or impurity. Both coatings are optically transparent and have physical characteristics similar to the coating of Example I except that a slightly lower optical bandgap is obtained.

EXAMPLE IV

A silicon substrate is coated as described in Example I. A central window is then etched through the silicon to the coating using an $SiO_2$ mask and ethylene diamine pyrocatecol. The coating stretches across the etched window and has the same physical and optical characteristics described in Example I.

EXAMPLE V

A silicon substrate is placed in a conventional diode sputtering apparatus with a carbon target. An argon atmosphere is provided in the deposition chamber with a few percent hydrogen ($H_2$) gas added.

Pressure in the chamber is maintained at about 10 milliTorr. An RF voltage is applied between the anode and the carbon target creating a plasma and sputtering of the target. A film deposits on the substrate at about 1 Å per second. When the film is about 1 μm thick, sputter deposition is stopped. A window is then back etched in the silicon substrate using an $SiO_2$ mask and ethylene diamine pyrocatecol, leaving the film stretching across the etched window. The film is composed of hydrogenated amorphous carbon having physical and optical properties substantial like the film described in Example I.

MASK PREPARATION

FIGS. 1.1 through 1.7 illustrate step-by-step the preparation of an X-ray mask in accordance with this invention. First, a film 10 of hydrogenated amorphous carbon (about 0.1 to 1.0 μm thick) is deposited on a substrate 12 (FIG. 1.1) by plasma deposition or sputter deposition of carbon and hydrogen onto a substrate at a temperature less than 375° C. and preferably less than 300° C. Preferably substrate 12 is silicon with a thickness of about 250–700 μm. Then an etch resistant mask 14 is applied to the back side of the substrate to define one or more openings 16 (FIG. 1.2). The back side is etched through the mask until a window 18 is formed defined by a supporting frame 20 (FIG. 1.3). A window as large as 100 mm is possible. Film 10 stretches across and covers window 18 forming a foil substrate supported by frame 20.

Next, an adhesion layer 22 (FIG. 1.4) is applied over the hydrogenated amorphous carbon foil. About 50 Å of chrome or titanium is suitable. On top of the adhesion layer, a plating base 24 is deposited. About 300 Å of gold or nickel is suitable. A resist layer 26 is deposited on top of the plating base 24. A resist layer thickness of about 8000 Å would be suitable.

A mask pattern 28 is then defined in resist layer 26 and developed (FIG. 1.5). For convenience, etch resistant mask 14 is shown to have been removed at this point during the developing step. It could be removed instead either earlier or later or not at all, if desired. An X-ray absorbing pattern 30 is then electroplated up through the mask pattern 28 to a thickness less than the thickness of resist layer 26 (FIG. 1.6). Finally, the resist layer 26 is removed, if desired or necessary, to produce an X-ray mask (FIG. 1.7).

Certain variations and modifications of this invention would be apparent to those of ordinary skill in this field and may be made without departing from the spirit and scope of this invention for example, while it is preferred that the window be formed before formation of the X-ray absorbing pattern, it should be apparent that the window could be formed instead after formation of the X-ray absorption pattern.

Having thus described our invention, what we claim as new, and desire to secure by Letters Patent is:

1. An X-ray mask comprising an X-ray absorbing pattern supported by a foil of hydrogenated amorphous carbon having an optical bandgap of at least one electron volt.

2. An X-ray mask as defined in claim 1 wherein said foil has at least 1 atom percent of hydrogen.

3. An X-ray mask as defined in claim 1 wherein said foil has an optical bandgap of at least 1.6 electron volts.

4. An X-ray mask as defined in claim 1 wherein said foil has at least 20 atom percent of hydrogen.

5. An X-ray mask as defined in claim 1 wherein said foil has an optical bandgap of about 2 electron volts.

6. An X-ray mask comprising an X-ray absorbing pattern supported by a substantially X-ray transparent foil, said supporting foil consisting essentially of hydrogenated amorphous carbon and having an optical bandgap of at least one electron volt.

7. An X-ray mask as defined in claim 6 wherein said foil has at least 1 atom percent of hydrogen.

8. An X-ray mask as defined in claim 6 wherein said foil has an optical bandgap of at least 1.6 electron volts.

9. An X-ray mask as defined in claim 6 wherein said foil has at least 20 atom percent of hydrogen.

10. An X-ray mask as defined in claim 6 wherein said foil has an optical bandgap of about 2 electron volts.

11. An X-ray mask comprising a substantially X-ray absorbing patterned layer supported by a substantially X-ray transparent foil, said foil comprising hydrogenated amorphous carbon and having an optical bandgap of at least one electron volt, and further comprising a frame supporting said X-ray transparent foil, said frame comprising silicon.

12. An X-ray mask as defined in claim 11 wherein said foil has at least 1 atom percent of hydrogen.

13. An X-ray mask as defined in claim 11 wherein said foil has an optical bandgap of at least 1.6 electron volts.

14. An X-ray mask as defined in claim 11 wherein said foil has at least 20 atom percent of hydrogen.

15. An X-ray mask as defined in claim 11 wherein said foil has an optical of about 2 electron volts.

16. An X-ray mask comprising a substantially X-ray absorbing patterned layer supported by a substantially X-ray transparent foil, said foil comprising hydrogenated amorphous carbon and having an optical bandgap of at least one electron volt, and further comprising a frame supporting said X-ray transparent foil, said frame comprising glass.

17. An X-ray mask as defined in claim 16 wherein said foil has at least 1 atom percent of hydrogen.

18. An X-ray mask as defined in claim 16 wherein said foil has an optical bandgap of at least 1.6 electron volts.

19. An X-ray mask as defined in claim 16 wherein said foil has about 20 atom percent of hydrogen.

20. An X-ray mask as defined in claim 16 wherein said foil has an optical bandgap of about 2 electron volts.

* * * * *